(12) United States Patent
Seesink et al.

(10) Patent No.: US 9,054,737 B1
(45) Date of Patent: Jun. 9, 2015

(54) ANALOG TO DIGITAL CONVERTER CIRCUIT

(71) Applicant: Dialog Semiconductor B.V., 's-Hertogenbosch (NL)

(72) Inventors: Petrus Hendrikus Seesink, Ouddorp (NL); Marinus Wilhelmus Kruiskamp, Den Bosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 14/308,770

(22) Filed: Jun. 19, 2014

(30) Foreign Application Priority Data

Dec. 9, 2013 (EP) .................................. 13196274

(51) Int. Cl.
  *H03M 1/34* (2006.01)
  *H03M 1/46* (2006.01)
  *H03M 1/00* (2006.01)

(52) U.S. Cl.
  CPC ................ *H03M 1/46* (2013.01); *H03M 1/002* (2013.01)

(58) Field of Classification Search
  USPC .................. 341/118, 120, 144, 155, 163, 172
  See application file for complete search history.

(56) References Cited

U.S. PATENT DOCUMENTS

| 6,433,724 | B1 | 8/2002 | Confalonieri et al. |
| 7,205,921 | B1 * | 4/2007 | Savla ............................ 341/155 |
| 7,233,273 | B2 * | 6/2007 | Tachibana et al. ............ 341/155 |
| 7,432,844 | B2 * | 10/2008 | Mueck et al. ................. 341/163 |
| 2004/0233093 | A1 | 11/2004 | Confalonieri et al. |

OTHER PUBLICATIONS

European Search Report, 13196274.8-1805, Mailed: Mar. 27, 2014, Dialog Semiconductor B.V.
"All-MOS Charge Redistribution Analog-to-Digital Conversion Techniques—Part I," by James L. McCreary et al., IEEE Journal of Solid-State Circuits, vol. SC-10, No. 6, Dec. 1975, pp. 371-379.

* cited by examiner

*Primary Examiner* — Peguy Jean Pierre
(74) *Attorney, Agent, or Firm* — Saile Ackerman LLC; Stephen B. Ackerman

(57) ABSTRACT

An analog-digital converter circuit is disclosed. Voltage control means is configured to control a voltage. Comparing means is configured to send a resulting comparative signal to the voltage control means. A first DAC is connected to the comparing means and to the voltage control means. Switching means connects an input means to the comparing means during a sampling phase. A second DAC is connected to the comparing means and to the voltage control means. A switching means connects input to the second DAC during a sampling phase, and connects voltage control means to DAC during a conversion phase. Switching means connects a second input to comparing means during a sampling phase.

14 Claims, 3 Drawing Sheets

US 9,054,737 B1

ANALOG TO DIGITAL CONVERTER CIRCUIT

TECHNICAL FIELD

The invention relates to an Analog to Digital Converter (ADC) circuit. The invention further relates to a system for sampling a signal including the ADC circuit and to a method for sampling a signal with an ADC circuit.

BACKGROUND

In system chips, usually digital and analog signals are processed. Signals in the system should be converted from one domain to the other. Analog to digital conversion may be necessary for complex digital processing, such as by a digital signal processor (DSP). Such conversion may be performed by Analog-to-Digital Converters (ADC).

A Successive Approximation Register (SAR) ADC converts an analog signal into a digital representation through several stages. Each stage, analog voltages are compared in order to produce a bit. In a SAR ADC, first the input voltage is sampled and held in the circuit, then a comparator compares the input voltage with the output of an internal Digital-to-Analog Converter (DAC) and sends the comparison result to a SAR. This first approximated digital code of the input signal is sent from the SAR to the DAC, which converts the value to an analog signal for supplying this signal to the comparator in order to compare this first approximation with the input signal. In "All MOS Charge Redistribution Analog-to-Digital Conversion Techniques—Part I" by Mc Creary and Gray, IEEE Journal of solid state, vol. sc-10, num. 6, December 1975, a special implementation of a SAR-ADC comprising a capacitive charge redistribution SAR-ADC is disclosed. In this implementation the DAC consists of a capacitive network and this capacitive network also acts as the sample capacitor. This kind of ADC's have a very good performance in terms of speed, power, and chip-area. Mainly, two kinds of sampling approaches are used in these circuits, a top plate sampling approach wherein the input signal is sampled at the input lines to the comparator, and a bottom plate sampling approach, wherein the input signal is sampled at the entrance of the DAC.

In a SAR ADC, the successive Approximation Register is initialized, for example with only the most significant bit set to one. This value is sent to the DAC, which converts it to its analog value (half of the reference voltage) for sending it to the comparator for comparing with the input signal. If the analog voltage exceeds the input signal, the SAR switches this bit to zero, otherwise it is left to one. In the next step, the next bit in the SAR is set to one and the same process is performed.

Very often, the DAC in the SAR ADC is implemented with an array of capacitors. In this case, if a differential structure of the array of capacitors is used, interferences in the circuit will be cancelled. This is an important advantage. Due to the small values of the capacitors in that kind of circuits, important interferences may appear.

The consequence of using a differential structure for the array of capacitors is that also a differential input signal should be sampled. However, in many applications, a single ended signal is available. One possible solution is to introduce an extra circuit before the ADC that converts the single ended signal to a differential signal. However, the new circuit will introduce additional area, additional power dissipation, and time delays.

SUMMARY

Therefore, a new approach that allows the use of a differential structure in a ADC to convert a single ended analog signal into a digital signal is necessary.

It would be advantageous to have an improved circuit for converting a single ended analog signal to digital. To better address this concern, a first aspect of the invention provides a circuit comprising:

voltage control means configured to control a voltage applied to each of a plurality of output lines;

comparing means connected to a first common line and a second common line and configured to receive a first signal from the first common line, and to receive a second signal from the second common line, wherein the comparing means is further configured to compare the first signal with the second signal, and to send a resulting comparative signal to the voltage control means;

first input means configured to receive a first input voltage;

first Digital-to-Analog Converter, DAC, means comprising an output and a plurality of inputs, wherein the output is connected to the first common line of the comparing means, and wherein the plurality of inputs is configured to be controlled by a first plurality of output lines of the voltage control means;

first switching means configured to keep the first input means connected to the first common line of the comparing means during a sampling phase, and to keep disconnected the first analog input means disconnected from the first common line of the comparing means during a conversion phase which follows the sampling phase;

second Digital-to-Analog Converter, DAC, means comprising an output and a plurality of inputs, wherein the output is connected to the second common line of the comparing means, and the plurality of inputs is configured to be controlled by a second plurality of the output lines of the voltage control means during the conversion means;

second switching means configured to keep the first input means connected to the plurality of inputs of the second DAC and to keep the plurality of, output lines of the voltage control means disconnected from the plurality of inputs of the second DAC during a sampling phase, and to keep the plurality of output lines of the voltage control means connected to the plurality of inputs of the second DAC and to keep the first input means disconnected from the plurality of inputs of the second DAC during the conversion phase which follows the sampling phase;

third switching means configured to keep a second voltage input connected to the second common line of the comparing means during the sampling phase and to keep the second voltage input disconnected from the second common line of the comparing means during the conversion phase which follows the sampling phase;

wherein the voltage control means is further configured to change the voltage values applied to the plurality of the output lines based on the resulting comparative signal received from the comparing means.

In this way, an ADC with a differential structure can be used to sample a single-ended signal. This analog-to-digital converter circuit may provide a more efficient use of time and/or power consumption, and/or silicon area, as an extra circuit is not necessary in order to convert a single-ended signal into a differential signal.

The voltage control means may comprise a Successive Approximation Register 'SAR'). This allows for an efficient way of storing the approximated results.

The first DAC and/or the second DAC may comprise an array of elements, wherein each element of the array comprises a first end and a second end, and wherein each first end of each element is connected to the output line of the DAC and each second end of each element is connected to a different one of the plurality of inputs of the DAC. In this way the approximate digital signal can be converted into an analog signal for further comparison in an efficient way using a charge redistribution network.

At least one of the elements may comprise an impedance. In this way, the charge redistribution network may be efficiently implemented.

The impedance may comprise a capacitor. This may allow for further improving the charge redistribution network. For instance, using binary weighted capacitors wherein each capacitor's capacitance represents a binary position of the digital representation of the input value, although other improved approaches may be used to get a better performance.

The second voltage input may be a constant voltage that does not depend on the analog input voltage. This allows for an efficient way of sampling a single-ended signal with a differential structure.

The second voltage input may be substantially equal to half an input range of the first input signal. This allows for an efficient way of sampling a single-ended-signal with a differential structure.

In another aspect, the invention provides a method comprising the steps of during a sampling phase:
receiving a first input voltage by a first input means;
connecting the first input means to a first common line of a comparing means;
connecting the first input means to a plurality of inputs of a second Digital-to Analog Converter DAC;
disconnecting a plurality of output lines of a voltage control means from the plurality of inputs of the second DAC, wherein each of the plurality of output lines of the voltage control means corresponds to a different input of the plurality of inputs of the DAC;
connecting a second voltage input to a second common line of the comparing means;
during a conversion phase which follows the sampling phase:
disconnecting the first input means from the first common line of the comparing means;
disconnecting the first input means from the plurality of inputs of the second DAC;
connecting the plurality of output lines of the voltage control means to the plurality of inputs of the second DAC by the second switching element, disconnecting the second voltage input from the second common line of the comparing means;
comparing a first signal received from the first common line with a second signal received from the second common line by the comparing means;
sending a resulting comparative signal to the voltage control means by the comparing means;
changing voltage values by the voltage control means, which are applied to the plurality of the output lines, based on the resulting comparative signal received from the comparing means;
controlling a voltage applied to each of a plurality of output lines by the voltage control means.

BRIEF DESCRIPTION OF THE DRAWINGS

These and other aspects of the invention are apparent from and will be elucidated with reference to the embodiments described hereinafter. In the drawings.

DESCRIPTION

Figure 1:
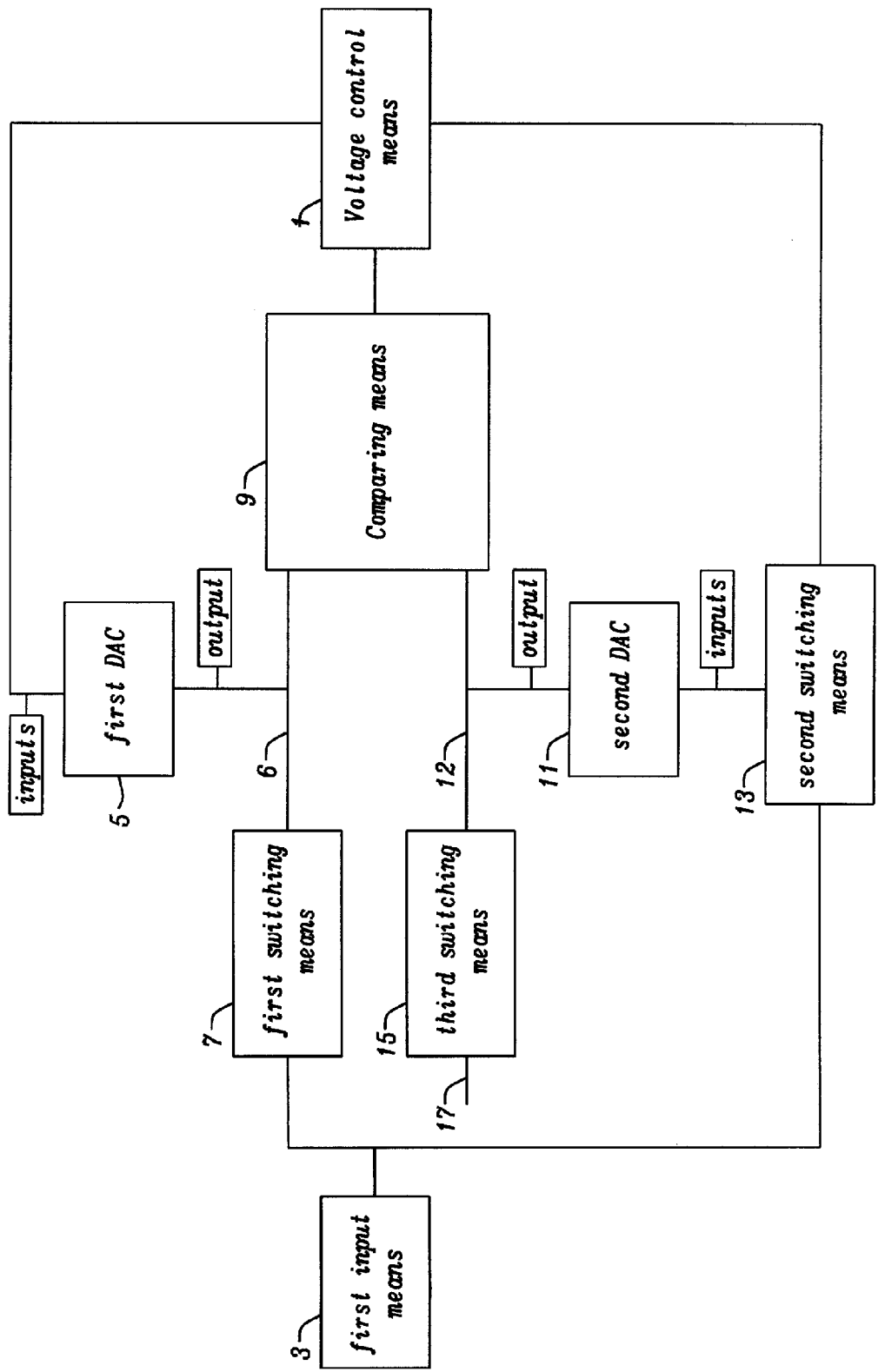
FIG. 1 is a diagram illustrating aspects of an Analog to Digital. Converter (ADC) circuit.

FIG. 1 is a diagram illustrating aspects of an Analog to Digital Converter (ADC) circuit. Although the system is described herein in detail, it will be understood that for many features described herein, alternative solutions may be used without departing from the scope of the claims.

The ADC circuit may comprise a voltage control means. The voltage control means may be configured to store a digital value. The digital value stored by the voltage control means may comprise any number of bits. The voltage control means may comprise a Successive Approximation Register (SAR) means 1. The voltage control means may have a number of output lines. The number of output lines may be any number. The number of output lines may be equal to the number of bits of the stored digital value. The SAR may be implemented by any kind of register or by any kind of storing element.

The circuit may further comprise a DAC convertor. The DAC convertor may receive a digital signal from the SAR in order to generate an analog voltage representing that digital signal. The DAC convertor may be comprised of an array of elements 5. These elements may comprise two ends. A first end of each element may be connected to one of the output lines of the voltage control means. A second end of each element may be connected to a common line 6. Each output line may be connected to a different element. The elements may be any kind of suitable elements. For instance, the elements may comprise resistors, or current sources, or capacitors, or any kind of impedance. The elements may be all of the same kind or may be of different kinds. The array of elements may contain any number of elements. The number of elements of the array may be equal to the number of bits of the stored digital value. The capacitance value of the capacitors may be binary weighted, meaning that each capacitor may represent a binary position, and its capacitance value may be adjusted in order to represent that binary position.

The ADC circuit may comprise a second DAC convertor. The second DAC convertor may comprise an array of elements 11. These elements may have two ends. A first end of each element may be connected to one of the output lines of the voltage control means. A second end of each element may be connected to a common line 12. Each output line may be connected to a different element. The elements may be any kind of suitable elements. For instance, the elements may comprise resistors, or current sources, or capacitors, or any kind of impedance. The elements may be all of the same kind or may be of different kinds. The elements may be of the same kind as the elements of array 5, or may be of another kind. The array of elements 11 may contain any number of elements. The number of elements of the array 11 may be equal to the number of bits of the stored digital value. The number of elements may be equal to the number of elements of the array of elements 5. The capacitance value of the capacitors may be binary weighted, meaning that each capacitor may represent a binary position. Its capacitance value may be adjusted in order to represent that binary position.

The ADC circuit may comprise comparing means 9. The comparing means 9 may comprise a first common line 6 and a second common line 12. The output of the first DAC 5 may be connected to the first common line 6 of the comparing means 9. The output of the second DAC 11 may be connected to the second common line 12 of the comparing means 9. The comparing means 9 may output a comparing resulting value based on the comparison performed between the value in the common line 6 and the value in the common line 12. The comparing resulting value may be sent to the voltage control means 1. The voltage control means may store a digital value based on the result of the comparison performed by comparing means 9.

The ADC circuit may comprise first input means 3. The first input means 3 may receive an input signal. The input signal may be any kind of signal. The input signal may be an analog voltage signal. The input signal may be a single ended signal.

The ADC circuit may comprise first switching means 7. The first switching means 7 may be implemented in any suitable way. The first switching means may switch to connect a signal received from the analog input means 3 to the first common line 6 of the comparing means 9. The first switching means may switch to disconnect a signal received from the analog input means 3 from the first common line 6 of the comparing means 9.

The ADC circuit may further comprise second switching means 13. The second switching means 13 may be implemented in any suitable way. The second switching means 13 may have two switching positions. The second switching element 13 may switch to a first switching position wherein a signal received from the analog input means 3 may be connected to the second end of each of the elements of the array of elements 11, while at the same time, the second end of each of the elements of the array of elements 11 may be disconnected from each of the output lines of the voltage control means. The second switching element 13 may switch to a second switching position. The second end of each of the elements of the array of elements 11 may be connected from each of the output lines of the voltage control means. At the same time, a signal received from the analog input means 3 may be disconnected from the second end of each of the elements of the array of elements 11.

The ADC circuit may comprise third switching means 15. The third switching means 15 may be implemented in any suitable way. The third switching means 15 may switch to connect a second voltage input 17 to the second common line 12 of the comparing means 9. The third switching means 15 may switch to disconnect a second voltage input 17 from the second common line 12 of the comparing means 9.

Figure 2:
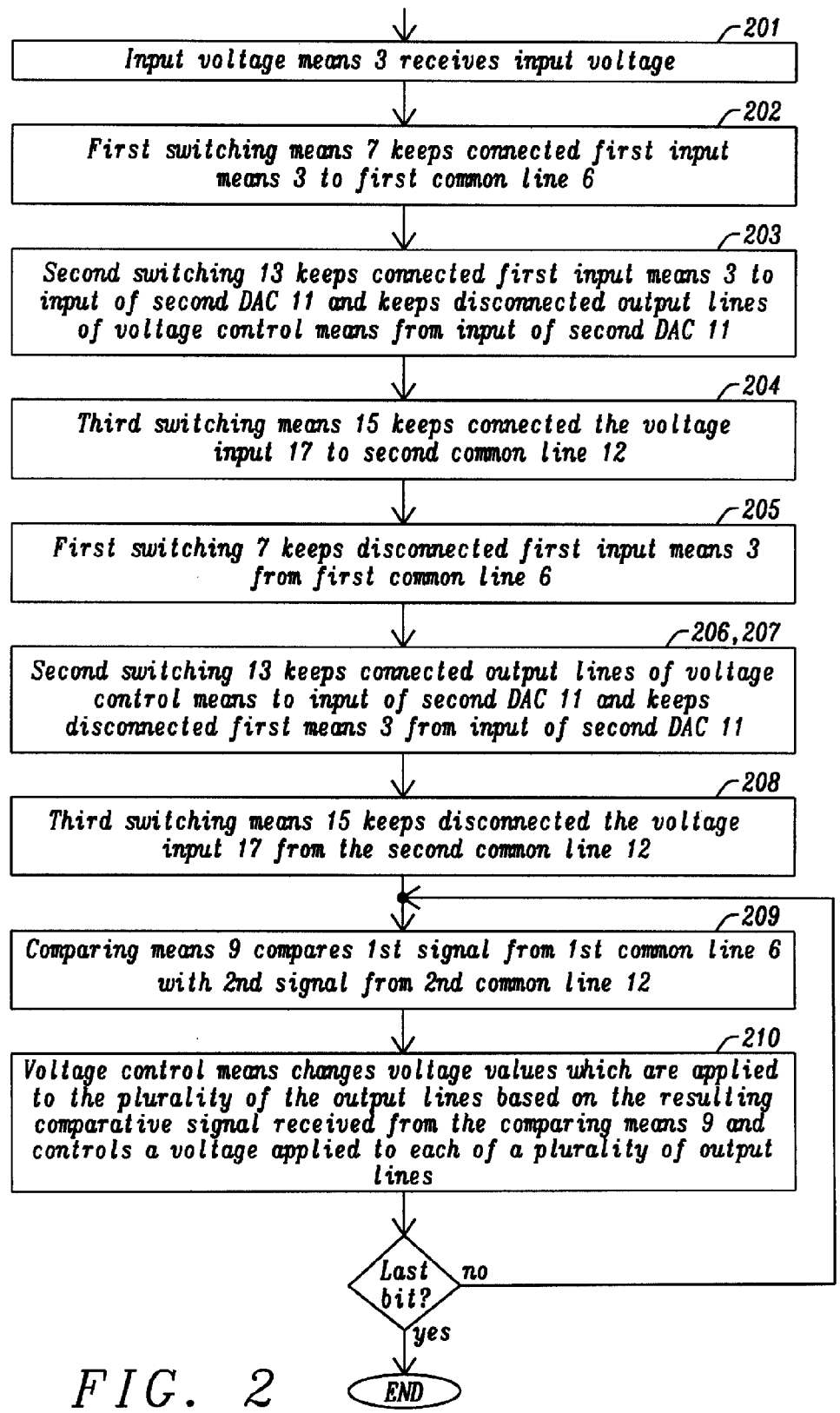
FIG. 2 is a flowchart illustrating an operation of the circuit.

FIG. 2 is a flowchart illustrating the circuit of FIG. 1 in operation. In step 201 the first input voltage means 3 receives an input voltage, for example an analog voltage. Simultaneously or sequentially, the first switching means 7, in step 202, connects the first input means 3 to the second ends of the elements of the first array of elements means 5. In step 203, simultaneously or sequentially, the second switching means 13 connects the first input means 3 to the second ends of the elements of the second array of elements means 11 and disconnects each of the plurality of output lines of the voltage control means from the second end of the corresponding element of the second element array means 11. In step 204, simultaneously or sequentially, the third switching element 15 connects the second voltage input 17 to the first ends of the elements of the second elements array means 11. The circuit stays in this state until the capacitors in the circuit have charged.

After the sampling phase, the conversion phase follows comprising the following steps. In step 205, the first switching means 7 disconnects the first input means 3 from the second ends of the elements of the first array of elements means 5. In step 206, the second switching means 13 connects each of the plurality of output lines of the voltage control means 1 to the second end of the corresponding capacitor of the second capacitor array means 11. In step 207, the second switching element 13 disconnects the first input means 3 from the second ends of the capacitors of the second capacitor array means 11. The third switching element 15, in step 208, disconnects the second voltage input 17 from the first ends of the capacitors of the second capacitors array means 11. In step 209, the comparing means 9 compares a first signal received from the first common line 6 with a second signal received from the second common line 12 and sends a resulting comparative signal to the voltage control means 1. In step 210, the voltage control means changes voltage values which are applied to the plurality of the output lines based on the resulting comparative signal received from the comparing means 9 and controls a voltage applied to each of a plurality of output lines. The method will go back to step 209 until preferably all the bits representing the input value have been generated. When all the bits have been generated, the analog to digital conversion method has finished. The method may continue from the step 202 to start a new sampling phase in order to sample a new input voltage.

Although the method has been described using capacitors, it may be applied to any other kind of DAC's.

Figure 3:
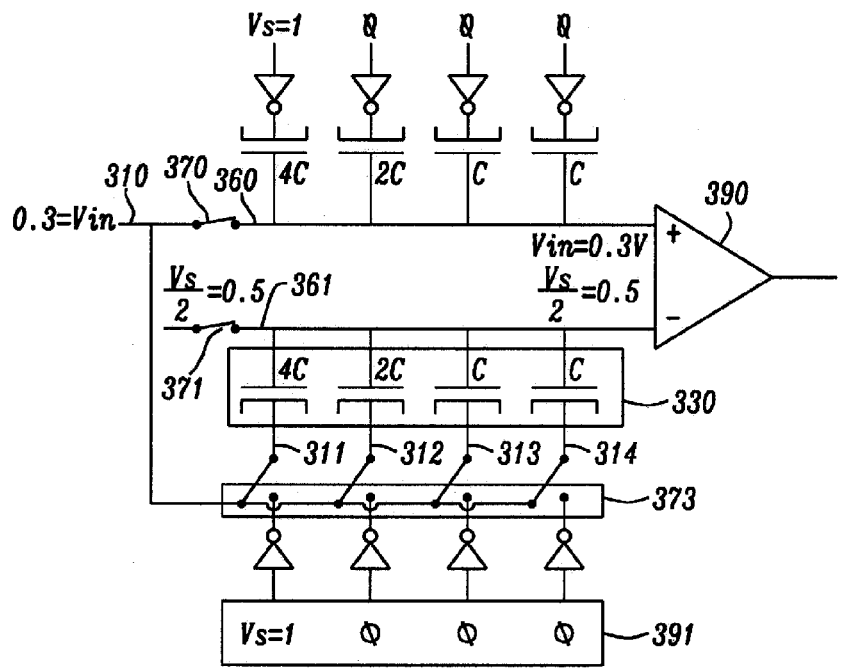
FIG. 3 is a diagram illustrating aspects of the circuit in a first mode of operation.
Figure 4:
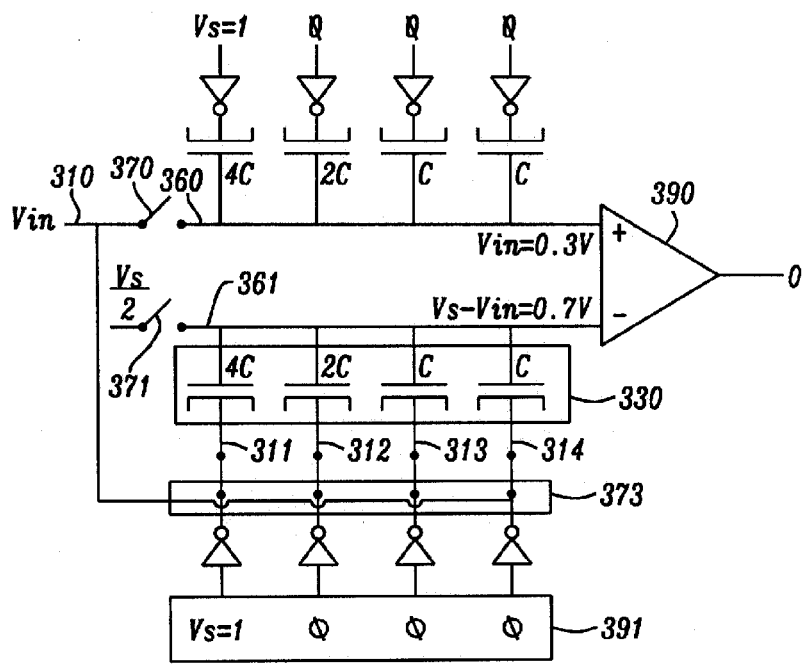
FIG. 4 is a diagram illustrating aspects of the circuit in a second mode of operation.

FIG. 3 and FIG. 4 are diagrams illustrating aspects of the circuit in operation.

FIG. 3 illustrates the sampling phase of an ADC circuit according to an embodiment of the invention. An input voltage 310 (in the example shown in FIG. 3, the input voltage 310 is 0.3) is applied to the first common line 360 of the comparing means 390 by keeping switching means 370 closed. The input voltage 310 is applied also to the input lines 311, 312, 313, and 314 of the second DAC 330 by switching means 373. A second input voltage substantially equal to half of the source voltage Vs (in the example shown in FIG. 3, Vs=1) is applied to the second common line 361 of the comparing means 390 by keeping switching means 371 closed. In this way, the capacitors in the circuit charge with a determined voltage. The input range of the circuit is usually from 0 to the voltage source.

FIG. 4 illustrates the first conversion phase for generating a first bit of an ADC circuit according to an embodiment of the invention. Switching means 370 and 371 are open. Switching means 373 switches to a new position in which the input lines 311, 312, 313, and 314 of capacitors 330 are now connected to the inverse of voltages 391 which in the first conversion phase are initialized to "1000". The voltages present at the input of the capacitors connected to the first common line 360 are also the inverse of "1000" in this first conversion phase. However, this is not a limitation. For example, the voltages may be alternatively initialized to "0111". Moreover, inversion of the signal is optional. In the rest of the conversion phases, these voltages will depend on the value of the comparison performed by the comparing means 390 between the value in the first common line 360 of the comparing means 390 and the voltage in the second common line 361 of the comparing unit 390. That is, a voltage will be present in the first and second common lines of the comparing means 390 (in the example shown in FIG. 4, the voltage present in the first common line 360 is 0.3 and the voltage present in the second common line 361 is 0.7). The comparing means 390 will output a comparing value result based on a comparison performed between the voltages presented in the first and second common lines (in the example shown in FIG. 4, the comparing means 390 outputs a "0" as the voltage present in the first common line 360 is smaller than the voltage present in the second common line 361), and this comparing value result will control in the next conversion phase. The voltages presented at the inputs of the invertors and consequently the voltage present in the first common line 360 and the second common line 361 will change. The comparing means 390 will output a new comparing result and in this way, an approximation of the digital value that corresponds to the input voltage 310 is calculated.

It will be understood that different implementation variations are possible and within reach of the person skilled in the art, based on the present description.

It should be noted that the above-described embodiments illustrate rather than limit the invention, and that those skilled in the art will be able to design many alternative embodiments without departing from the scope of the appended claims. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. An analog-to-digital converter circuit comprising:
    voltage control means configured to control a voltage applied to each of a plurality of output lines;
    comparing means connected to a first common line and a second common line and configured to receive a first signal from the first common line, and to receive a second signal from the second common line, wherein the comparing means is further configured to compare the first signal with the second signal, and to send a resulting comparative signal to the voltage control means;
    first input means configured to receive a first input voltage;
    first Digital-to-Analog Converter, DAC, means comprising an output and a plurality of inputs, wherein the output is connected to the first common line of the comparing means, and wherein the plurality of inputs is configured to be controlled by a first plurality of output lines of the voltage control means;
    first switching means configured to keep the first input means connected to the first common line of the comparing means during a sampling phase, and to keep the first input means disconnected from the first common line of the comparing means during a conversion phase which follows the sampling phase;
    second Digital-to-Analog Converter, DAC means comprising an output and a plurality of inputs, wherein the output is connected to the second common line of the comparing means, and the plurality of inputs is configured to be controlled by a second plurality of output lines of the voltage control means during the conversion phase;
    second switching means configured to keep connected the first input means to the plurality of inputs of the second DAC and to keep the plurality of output lines of the voltage control means disconnected from the plurality of inputs of the second DAC during the sampling phase, and to keep the plurality of output lines of the voltage control means connected to the plurality of inputs of the second DAC and to keep disconnected the first input means from the plurality of inputs of the second DAC during the conversion phase which follows the sampling phase;
    third switching means configured to keep a second voltage input connected to the second common line of the comparing means during the sampling phase and to keep the second voltage input disconnected from the second common line of the comparing means during the conversion phase which follows the sampling phase;
    wherein the voltage control means is further configured to change the voltage values applied to the plurality of the output lines based on the resulting comparative signal received from the comparing means.

2. The analog-to-digital converter circuit of claim 1, wherein the voltage control means comprises a Successive Approximation Register 'SAR'.

3. The analog-to-digital converter circuit of claim 1, wherein the first DAC and/or the second DAC comprises an array of elements, wherein each element of the array comprises a first end and a second end, and wherein each first end of each element is connected to the output line of the DAC and each second end of each element is connected to a different one of the plurality of inputs of the DAC.

4. The analog-to-digital converter circuit of claim 3, wherein at least one of the elements comprises an impedance.

5. The analog-to-digital converter circuit of claim 4, wherein the impedance comprises a capacitor.

6. The analog-to-digital converter circuit of claim 1, wherein the second voltage input is a constant voltage that does not depend on the analog input voltage.

7. The analog-to-digital converter circuit of claim 6, wherein the second voltage input is substantially equal to half an input range of the first input signal.

8. An analog-to-digital conversion method comprising the steps of:
    during a sampling phase:
        receiving a first input voltage by a first input means;
        connecting the first input means to a first common line of a comparing means;
        connecting the first input means to a plurality of inputs of a second Digital-to-Analog Converter DAC;
        disconnecting a plurality of output lines of a voltage control means from the plurality of inputs of the second DAC, wherein each of the plurality of output lines of the voltage control means corresponds to a different input of the plurality of inputs of the DAC;
        connecting a second voltage input to a second common line of the comparing means;
    during a conversion phase which follows the sampling phase:
        disconnecting the first input means from the first common line of the comparing means;
        disconnecting the first input means from the plurality of inputs of the second DAC;
        connecting the plurality of output lines of the voltage control means to the plurality of inputs of the second DAC, disconnecting the second voltage input from the second common line of the comparing means;
        comparing a first signal received from the first common line with a second signal received from the second common line by the comparing means;
        sending a resulting comparative signal to the voltage control means by the comparing means;
        changing voltage values by the voltage control means, which are applied to the plurality of the output lines, based on the resulting comparative signal received from the comparing means;

controlling a voltage applied to each of a plurality of output lines by the voltage control means.

9. The analog-to-digital conversion method of claim 8, wherein the voltage control means comprises a Successive Approximation Register 'SAR'.

10. The analog-to-digital conversion method of claim 8, wherein the first DAC and/or the second DAC comprises an array of elements, wherein each element of the array comprises a first end and a second end, and wherein each first end of each element is connected to the output line of the DAC and each second end of each element is connected to different one of the plurality of inputs of the DAC.

11. The analog-to-digital conversion method of claim 10, wherein at least one element comprises an impedance.

12. The analog-to-digital conversion method of claim 11, wherein the impedance comprises a capacitor.

13. The analog-to-digital conversion method of claim 8, wherein the second voltage input is a constant voltage that does not depend on the analog input voltage.

14. The analog-to-digital conversion method of claim 13, wherein the second voltage input is substantially equal to half an input range of the first input signal.

\* \* \* \* \*